United States Patent
Lu

(10) Patent No.: US 8,053,282 B2
(45) Date of Patent: Nov. 8, 2011

(54) MOUNTING STRUCTURE OF COMPONENT OF LIGHTING DEVICE AND METHOD THEREOF

(76) Inventor: Shao-Yu Lu, Taoyuan (TW)

( * ) Notice: Subject to any disclaimer, the term of this patent is extended or adjusted under 35 U.S.C. 154(b) by 70 days.

(21) Appl. No.: 12/654,128

(22) Filed: Dec. 11, 2009

(65) Prior Publication Data

US 2010/0149810 A1    Jun. 17, 2010

(30) Foreign Application Priority Data

Dec. 15, 2008    (TW) ................................ 97148710 A

(51) Int. Cl.
     *H01L 21/50*      (2006.01)
     *H01L 21/48*      (2006.01)
     *H01L 21/44*      (2006.01)
     *H01L 21/00*      (2006.01)
     *H01L 29/18*      (2006.01)
     *H01L 23/12*      (2006.01)
     *H01L 23/52*      (2006.01)

(52) U.S. Cl. ............ 438/118; 438/121; 438/22; 438/26; 257/88; 257/733; 257/783

(58) Field of Classification Search .................. 438/118, 438/121, 22, 26; 257/88, 733, 783
See application file for complete search history.

(56) References Cited

U.S. PATENT DOCUMENTS 5,338,704 A *   8/1994   Imai et al. ..................... 438/119
2009/0311815 A1 *   12/2009   Miyachi et al. ................. 438/31
* cited by examiner

*Primary Examiner* — Luan C Thai
(74) *Attorney, Agent, or Firm* — Rosenberg, Klein & Lee

(57) ABSTRACT

Disclosed is a structure for mounting a component to a lighting device, including at least one lighting-device base, at least one metal film, and a lighting array chip. The lighting-device base has a surface to which a first layer of metal bonding agent is applied. The metal film has a surface attached to the first metal bonding agent layer on the surface of the lighting-device base. The lighting array chip has a bottom surface to which a second layer of metal bonding agent is applied. The second metal bonding agent layer is further attached to an opposite surface of the metal film so as to securely mount the lighting array chip to the surface of the lighting-device base. A mounting method is also provided, including the steps of applying a metal bonding agent to a surface of a lighting-device base; connecting the lighting-device base to a positive electrode of a power source; connecting a metal film to a negative electrode of the power source; applying a metal bonding agent to a lighting array chip; bonding the lighting array chip to the metal film; and hot-pressing to bond the lighting array chip to the lighting-device base, so that the lighting array chip is securely mounted to the surface of the lighting-device base by means of thermal fusion caused between the negative and positive polarities of the power source applied to the metal film and the lighting-device base.

11 Claims, 6 Drawing Sheets

MOUNTING STRUCTURE OF COMPONENT OF LIGHTING DEVICE AND METHOD THEREOF

BACKGROUND OF THE INVENTION

1. Field of the Invention

The present invention relates to a structure and a method for mounting a component of a lighting device, and in particular to a structure and a method that are applicable to a light-emitting diode (LED) lighting device and that mount a lighting array chip to a lighting-device base through electrical thermal fusion carried out on a metal film through connection with positive and negative electrodes of an external power source.

2. The Related Arts

Conventional light-emitting diode (LED) based lighting devices have been widely used in outdoor public lighting and indoor decoration for providing lighting with energy saving and environmental conversation. However, the conventional LED lighting device comprises an LED array chip that is first attached to internal parts of the lighting device through thermally conductive adhesive agent and then further fastened to thereby securely fix the LED array chip. Using thermally conductive adhesive agent to bond the LED array chip often leads to poor performance of heat transfer for the LED array chip, causing potential risk of damaging the LED array chip and optic loss. Thus, the reliability of the light source when the LED array chip is applied to a lighting device deteriorated.

SUMMARY OF THE INVENTION

The above discussed known structure and method for mounting an LED array chin in an LED lighting device requires initial bonding with thermally conductive adhesive and subsequent fastening operation to securely fix the LED array chip and this often leads to poor performance of heat transfer, potential risk of damaging the LED array chip, and optic loss, making the reliability of the light source deteriorated.

Thus, the present invention aims to provide a mounting structure for a component of a lighting device, comprising at least one lighting-device base, at least one metal film, and a lighting array chip. The lighting-device base has a surface to which a first layer of metal bonding agent is applied. The metal film has a surface attached to the first metal bonding agent layer on the surface of the lighting-device base. The lighting array chip has a bottom surface to which a second layer of metal bonding agent is applied. The second metal bonding agent layer is further attached to an opposite surface of the metal film so as to securely mount the lighting array chip to the surface of the lighting-device base.

The present invention also provides a method for mounting a component to a lighting device, comprising the steps of applying a metal bonding agent to a surface of a lighting-device base; connecting the lighting-device base to a positive electrode of a power source; connecting a metal film to a negative electrode of the power source; applying a metal bonding agent to a lighting array chip; bonding the lighting array chip to the metal film; and hot-pressing to bond the lighting array chip to the lighting-device base, so that the lighting array chip is securely mounted to the surface of the lighting-device base by means of thermal fusion caused between the negative and positive polarities of the power source applied to the metal film and the lighting-device base.

The effectiveness of the structure and method for mounting a component to a lighting device in accordance with the present invention makes the lighting array chip directly bonded to the lighting-device base through electrical thermal fusion induced in a metal alloy film by connection with positive and negative electrodes of an external power source, so that the mounting/assembling of the LED lighting device is made easy and convenient. Further, with the structure and method for mounting a component to a lighting device in accordance with the present invention that is carried out through electrical thermal fusion, the performance of heat transfer for the lighting array chip is improved and the problems of damage and optic loss of the lighting array chip conventionally caused by poor heat transfer performance resulting from use of thermally conductive adhesive agents can effectively eliminated so that reliability of the lighting array chip serving as a light source is enhanced.

BRIEF DESCRIPTION OF THE DRAWINGS

The present invention will be apparent to those skilled in the art by reading the following description of a preferred embodiment of a mounting structure thereof and the best mode for carrying a mounting method in accordance with the present invention, with reference to the attached drawings, wherein.

DETAILED DESCRIPTION OF THE PREFERRED EMBODIMENT AND THE BEST MODE FOR CARRYING OUT THE PRESENT INVENTION

Figure 1:
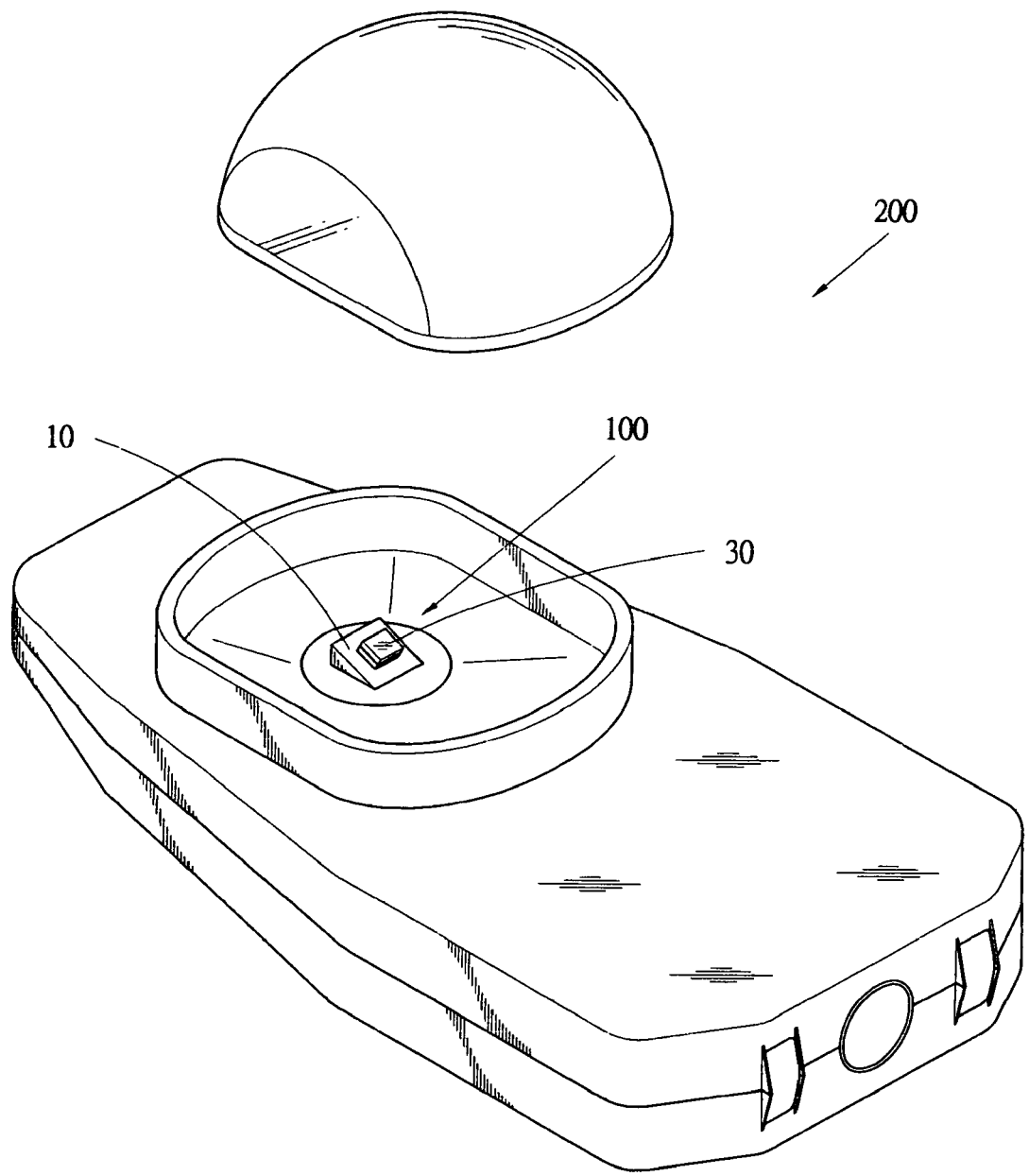
FIG. 1 is an exploded view illustrating a mounting structure of a component of a lighting device in accordance with the present invention.
Figure 2:
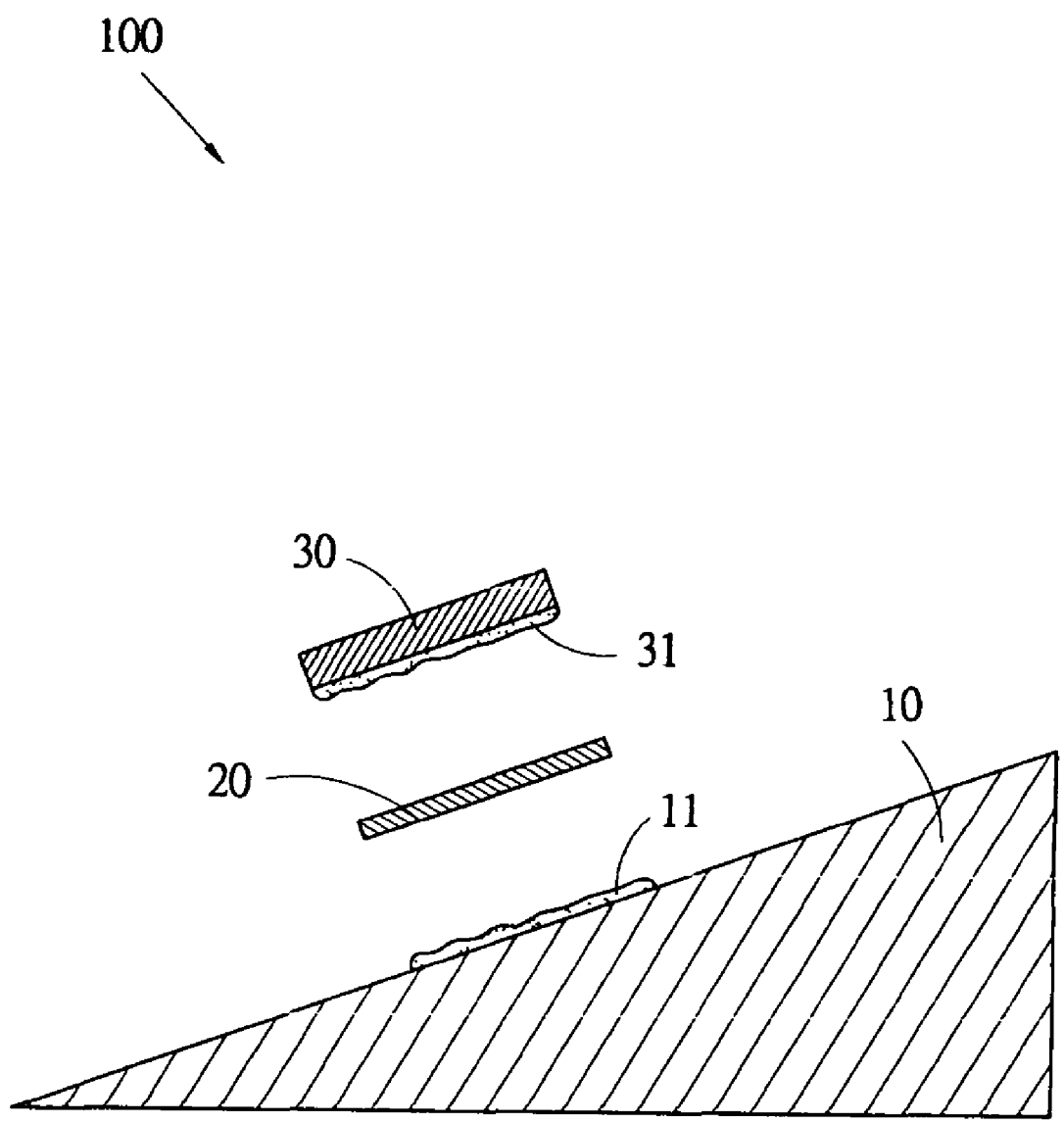
FIG. 2 is a schematic cross-sectional view of the lighting device component mounting structure of the present invention.

With reference to the drawings and in particular to FIGS. 1 and 2, a mounting structure, generally designated at 100, is provided by the present invention for mounting a component of a lighting device. The mounting structure 100 comprises a lighting-device base 10, which is arranged inside a light-emitting diode (LED) based lighting device 200. The lighting-device base 10 is made of an electrically conductive material and has a surface to which a first layer 11 of metal bonding agent, which is electrically conductive, is bonded. The metal bonding agent layer 11 is not limited to any specific type and a tin soldering paste is taken as an example in the embodiment illustrated. Of course, other equivalent electrically conductive metal bonding agents or substances may also be used and are considered within the scope of the present invention defined in the appended claims.

At least one metal film 20 is made of a thin film conductor formed by a mixture of at least two kinds of metal powders, or a conductive alloy. An example is a film made of for example palladium alloys, silver alloys, tin alloys, or indium tin oxides (ITO). The metal film 20 has a surface attached or bonded to the first metal bonding agent layer 11 on the surface of the lighting-device base 10.

A lighting array chip 30 is formed as a device comprising an array of a plurality of LEDs. The lighting array chip 30 has a bottom surface to which a second layer 31 of metal bonding agent is applied. The second metal bonding agent layer 31 is not limited to any specific type and tin soldering paste is taken as an example in the embodiment illustrated. The second metal bonding agent layer 31 is attached to or bonded to an opposite surface of the metal film 20 for bonding the lighting array chip 30 to the surface of the lighting-device base 10.

Figure 3:
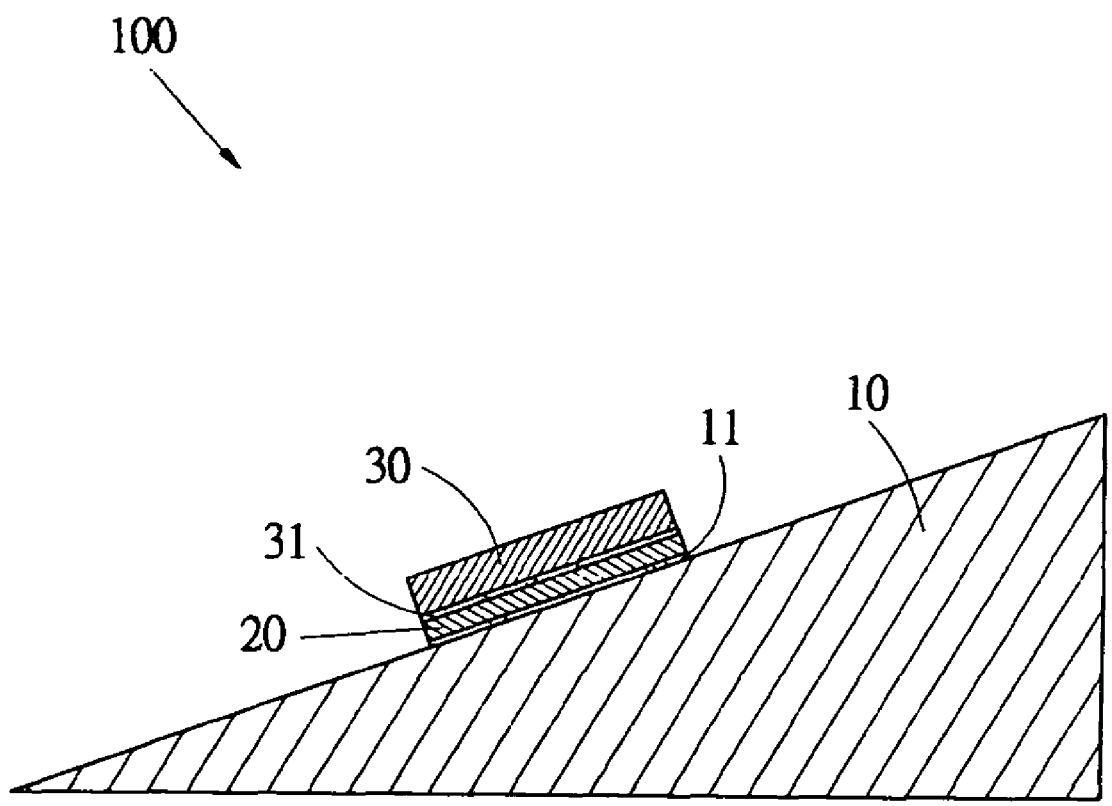
FIG. 3 is a schematic cross-sectional view illustrating the lighting device component mounting structure of the present invention in an assembled form.

Also referring to FIG. 3, the first metal bonding agent layer 11 of the lighting-device base 10, the metal film 20, and the second metal bonding agent layer 31 of the lighting array chip 30 of the mounting structure 100 in accordance with the present invention are subjected to processing realized through various hot-fusing methods, so as to securely bond the lighting array chip 30 to the surface of the lighting-device base 10. The bonding method will be explained in the following.

Figure 4:
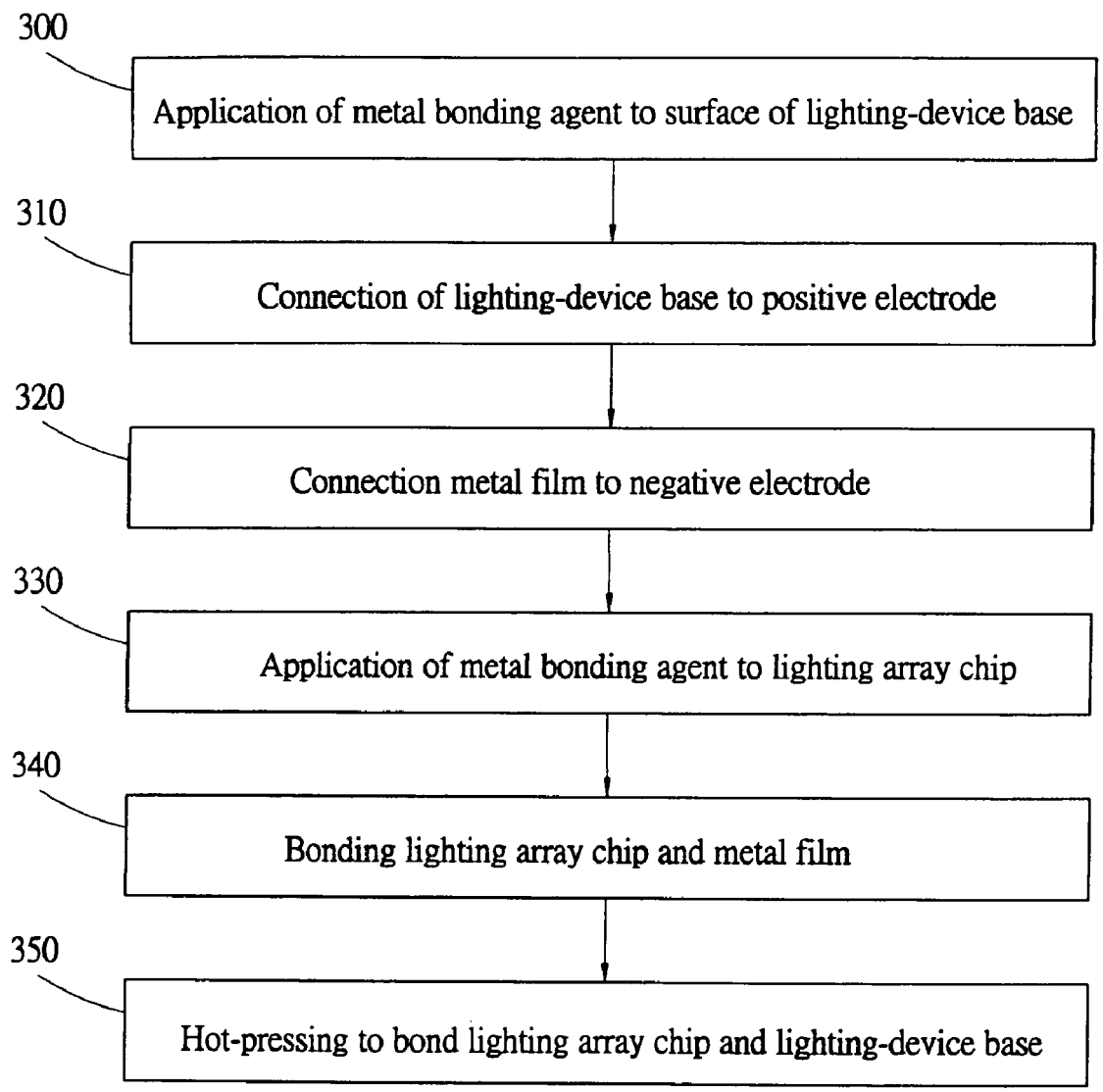
FIG. 4 is a flow chart illustrating a method of mounting the component of the lighting device in accordance with the present invention.
Figure 5:
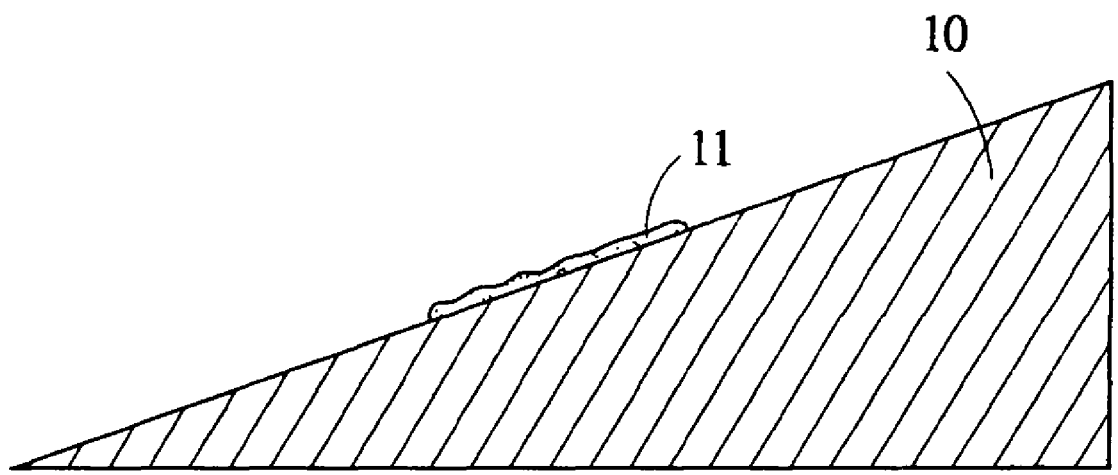
FIG. 5 is a schematic cross-sectional view illustrating the condition where a first layer of metal bonding agent is applied to a lighting-device base in the method of mounting the component of the lighting device.
Figure 6:
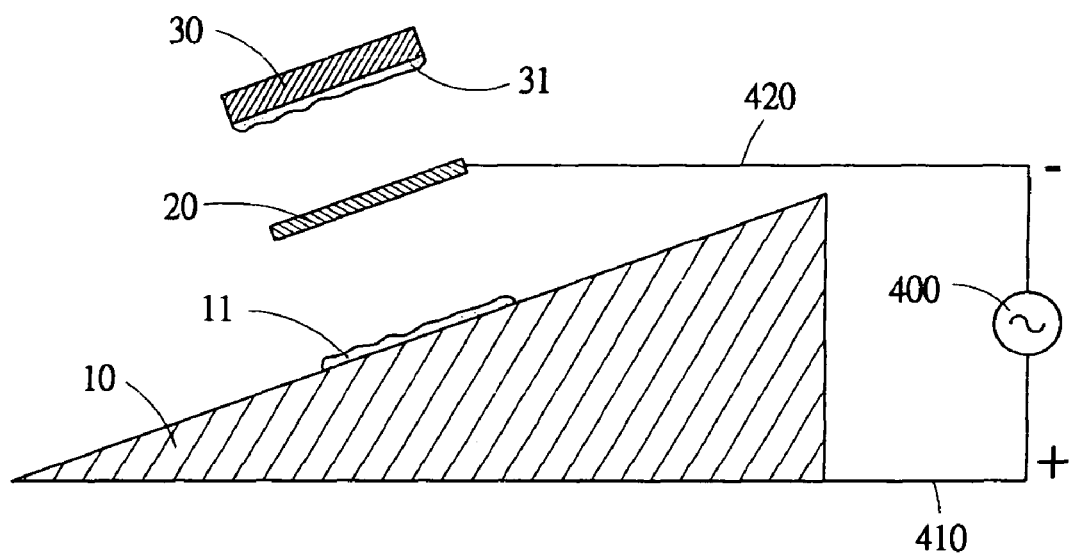
FIG. 6 is schematic cross-sectional view illustrating the condition where the lighting-device base and the metal film are respectively connected to positive and negative electrodes of an external power source in the method of mounting the component of the lighting device.

Reference is now made to FIGS. 4-6. FIG. 4 illustrates a flow chart of the method for mounting an LED lighting array chip in accordance with the present invention, comprising the following steps 300-350, wherein:

Step 300: application of metal bonding agent to surface of lighting-device base, wherein, as illustrated in FIG. 5, a first layer 11 of metal bonding agent is applied to a surface of a lighting-device base 10;

Step 310: connection of lighting-device base to positive electrode, wherein, as illustrated in FIG. 6, the lighting-device base 10 obtained in step 300 is electrically connected to a positive electrode 410 of an external power source 400 so as to make both the lighting-device base 10 and the first metal bonding agent layer 11 carrying positive charges;

Step 320: connection metal film to negative electrode, wherein a metal film 20 is electrically connected to a negative electrode 420 of the external power source 400 provided in step 310 to make the metal film 20 carrying negative charges;

Step 330: application of metal bonding agent to lighting array chip, wherein a second layer 31 of metal bonding agent is applied to a bottom surface of a lighting array chip 30;

Step 340: bonding lighting array chip and metal film, wherein the metal film 20 of step 320 is positioned on and bonded to the lighting array chip 30 of step 330; and Step 350: hot-pressing to bond lighting array chip and lighting-device base, wherein the lighting array chip 30 to which the metal film 20 is bonded in step 340 is pressed toward the first metal bonding agent layer 11 of the lighting-device base 10 to have a surface of the metal film 20 positioned on and bonded to a surface of the first metal bonding agent layer 11, and causing instantaneous thermal fusion among the negatively charged metal film 20, the second metal bonding agent layer 31, and the first metal bonding agent layer 11 that is formed on the surface of the positively charged lighting-device base 10 so as to securely bond the lighting array chip 30 to the surface of the lighting-device base 10.

In the process of mounting the LED array chip in accordance with the present invention shown in the above discussed FIGS. 4-6, the electrical polarity of the electrode of the external power source 400 to which the lighting-device base 10 is connected in step 310 and the electrical polarity of the electrode of the external power source 400 to which the metal film 20 is connected in step 320 are not limited to the specific arrangement that the lighting-device base 10 is connected to the positive polarity 410 of the power source and the metal film 20 connected to the negative polarity 420 of the power source, and other arrangement, such as the lighting-device base 10 being connected to the negative polarity 420 and the metal film 20 connected to the positive polarity 410, or other equivalent arrangements, which are all considered within the scope of the present invention.

Although the present invention has been described with reference to the preferred embodiment thereof and the best mode for carrying out the present invention, it is apparent to those skilled in the art that a variety of modifications and changes may be made without departing from the scope of the present invention which is intended to be defined by the appended claims.

What is claimed is:

1. A structure for mounting a component to a lighting device, comprising:
    a lighting-device base, which is arranged inside the lighting device, the lighting-device base being made of an electrically conductive material and having a surface to which a first layer of metal bonding agent is applied;
    at least one metal film, which has a first surface attached to the first metal bonding agent layer on the surface of the lighting-device base; and
    a lighting array chip, which comprises an assembly formed of an array of light emitting diodes, the lighting array chip having a bottom surface to which a second layer of metal bonding agent is applied, the second metal bonding agent layer being further attached to an opposite second surface of the metal film, whereby the lighting array chip is securely mounted to the surface of the lighting-device base by means of thermal fusion among the first metal bonding agent layer of the lighting-device base, the metal film, and the second metal bonding agent layer.

2. The structure as claimed in claim 1, wherein the first metal bonding agent layer of the lighting-device base comprises tin soldering paste.

3. The structure as claimed in claim 1, wherein the metal film comprises a film conductor made of a mixture of at least two types of metal powders.

4. The structure as claimed in claim 1, wherein the metal film is made of a metal alloy.

5. The structure as claimed in claim 1, wherein the second metal bonding agent layer of the lighting array chip comprises tin soldering paste.

6. A method for mounting a component to a lighting device comprising the following steps:
    (a) application of metal bonding agent to surface of lighting-device base, wherein a first layer of metal bonding agent is applied to a surface of a lighting-device base;
    (b) connection of lighting-device base to positive electrode, wherein the lighting-device base of step (a) is electrically connected to a positive electrode of an external power source so as to make both the lighting-device base and the first metal bonding agent layer carrying positive charges;
    (c) connection metal film to negative electrode, wherein a metal film is electrically connected to a negative electrode of the external power source provided in step (b) to make the metal film carrying negative charges;
    (d) application of metal bonding agent to lighting array chip, wherein a second layer of metal bonding agent is applied to a bottom surface of a lighting array chip;
    (e) bonding lighting array chip and metal film, wherein the metal film of step (c) is positioned on and bonded to the lighting array chip of step (d); and (f) hot-pressing to bond lighting array chip and lighting-device base, wherein the lighting array chip to which the metal film is bonded in step (e) is pressed toward the first metal bonding agent layer of the lighting-device base to have a surface of the metal film positioned on and bonded to a surface of the first metal bonding agent layer; and causing instantaneous thermal fusion among the negatively charged metal film, the second metal bonding agent layer, and the first metal bonding agent layer that is set on the surface of the positively charged lighting-device base so as to securely bond the lighting array chip to the surface of the lighting-device base.

7. The method as claimed in 6, wherein the first metal bonding agent layer of the lighting-device base of step (a) comprises tin soldering paste.

8. The method as claimed in 6, wherein the metal film of step (c) comprises a film conductor made of a mixture of at least two types of metal powders.

9. The method as claimed in 6, wherein the metal film of step (c) is made of a metal alloy.

10. The method as claimed in 6, wherein the lighting array chip of step (d) comprises a device formed by an array of light-emitting diodes.

11. The method as claimed in 6, wherein the second metal bonding agent layer of the lighting array chip of step (d) comprises tin soldering paste.

\* \* \* \* \*